(12) United States Patent
Nielsen et al.

(10) Patent No.: US 7,453,125 B1
(45) Date of Patent: Nov. 18, 2008

(54) DOUBLE MESH FINFET

(75) Inventors: Alexander Nielsen, Ingolstadt (DE); Bernhard Dobler, Erding (DE); Georg Georgakos, Erding (DE); Ralf Weber, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/739,420

(22) Filed: Apr. 24, 2007

(51) Int. Cl.
   *H01L 29/76* (2006.01)
   *H01L 29/94* (2006.01)
   *H01L 31/00* (2006.01)

(52) U.S. Cl. ............... 257/390; 257/401; 257/E27.013

(58) Field of Classification Search ............... 257/390, 257/401, E27.013
See application file for complete search history.

(56) References Cited

U.S. PATENT DOCUMENTS 6,989,308 B2 * 1/2006 Furukawa et al. ........... 438/283
7,013,447 B2 * 3/2006 Mathew et al. ............... 716/11
7,015,078 B1 * 3/2006 Xiang et al. ................ 438/149

* cited by examiner

*Primary Examiner*—Ngan Ngo
(74) *Attorney, Agent, or Firm*—Schwegman, Lundberg & Woessner, P.A.

(57) ABSTRACT

A multiple gate field-effect transistor is built from an overlapping mesh assembly. The assembly comprises a first layer comprising a semiconductor material formed into at least one fin, at least one source, and at least one drain. The first layer comprises a portion of a first mesh, electrically separated from the rest of the mesh. Similarly, a second layer is formed over the first layer and electrically isolated from the first layer, the second layer being electrically conductive and comprising a gate for the at least on fin of the transistor. The second layer comprises a portion of a second mesh offset from the first mesh and overlapping the first mesh, the second layer of the MuGFET device electrically separated from the rest of the second mesh.

14 Claims, 6 Drawing Sheets

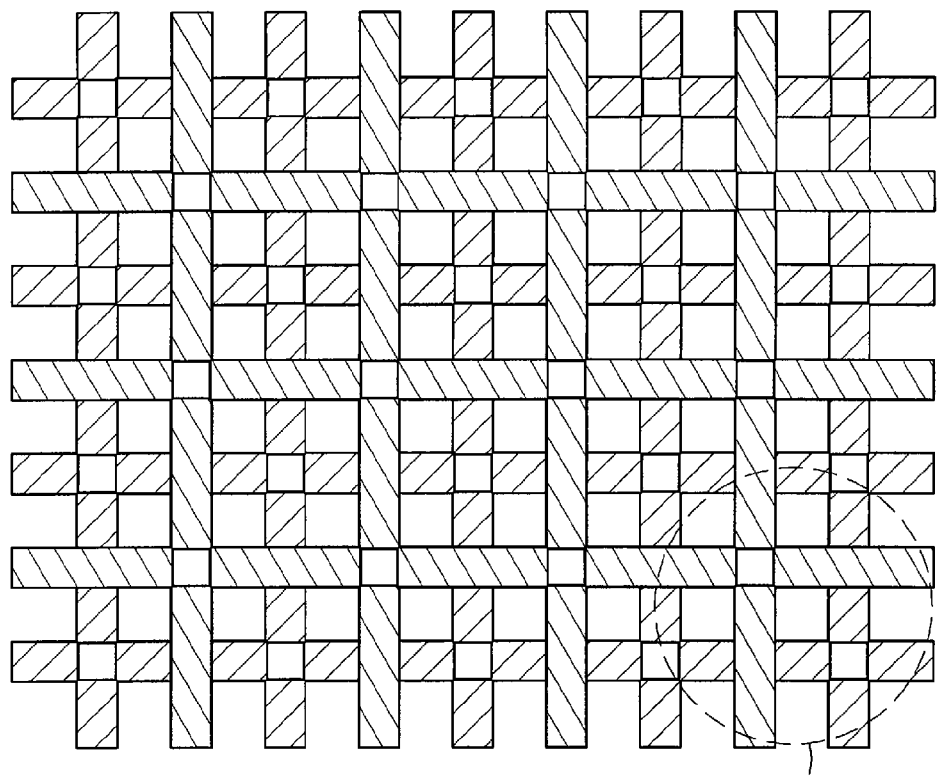
FIG. 5B
FIG. 5A
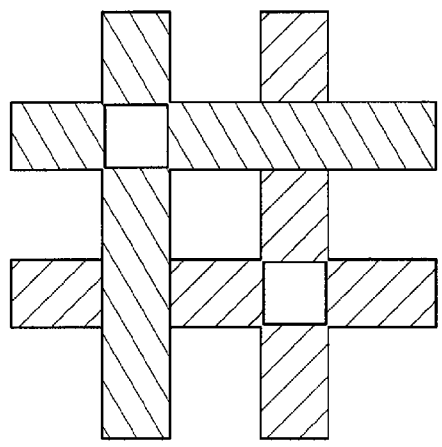
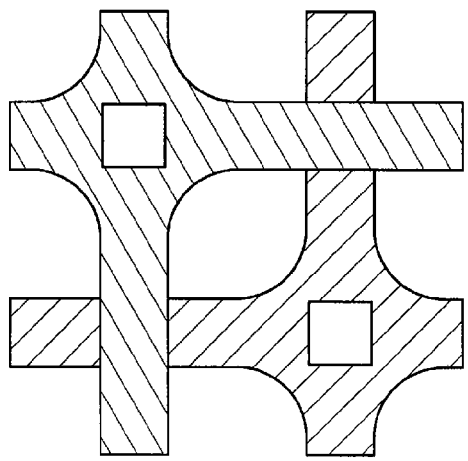
FIG. 5B          FIG. 5C

RESIST HOLES FOR GATES

RESIST HOLES FOR FIN

DOUBLE MESH FINFET

FIELD OF THE INVENTION

The invention relates generally to semiconductor devices, and more specifically in one embodiment to a double mesh array for formation of MuGFET devices.

BACKGROUND

Semiconductor devices such as transistors and integrated circuits are typically formed on a substrate of a semiconducting material, using processes such as etching, lithography, and ion implantation to form various structures and materials on the substrate. A single field-effect transistor (FET), for example, may require a dozen or more steps to form implanted source and drain regions, an insulating layer, and a gate separated from the channel region by the insulating region.

In operation, doped source and drain regions are coupled to a circuit such that a voltage signal applied to the gate region controls the conductivity or resistivity of a channel region physically located between the source and drain regions. The conductivity of the channel region is based on an electric field created by potential applied to the gate, relative to the voltages present at the source and drain. Field effect transistors are sometimes described as being voltage-controlled resistors for this reason, and are used for applications such as amplifiers, signal processing, and control systems.

Field effect transistors are also very common in digital logic circuits such as in computer processors, memory, and other digital electronics. The voltage applied to the gate in such applications is typically intended to either turn off the FET completely or turn it on completely, such that the FET operates more like a switch than a variable resistor. For such applications, the switching speed, device size, leakage current, and a variety of other parameters are designed to provide the desired device size and operating characteristics, within the limitations of available technology. It is therefore desirable to control various parameters of field effect transistors to produce field effect transistors suited for various applications.

BRIEF DESCRIPTION OF THE FIGURES

FIG. 5A illustrates the double mesh structure of FIG. 4 filled with contacts, consistent with an example embodiment of the invention.

FIG. 5B illustrates a detail view of a theoretical intersection of mesh elements with a contact formed thereon, consistent with an example embodiment of the invention.

FIG. 5C illustrates a detail view of a practical intersection of mesh elements with a contact formed thereon, consistent with an example embodiment of the invention.

DETAILED DESCRIPTION

In the following detailed description of example embodiments of the invention, reference is made to specific example embodiments of the invention by way of drawings and illustrations. These examples are described in sufficient detail to enable those skilled in the art to practice the invention, and serve to illustrate how the invention may be applied to various purposes or embodiments. Other embodiments of the invention exist and are within the scope of the invention, and logical, mechanical, electrical, and other changes may be made without departing from the subject or scope of the present invention. Features or limitations of various embodiments of the invention described herein, however essential to the example embodiments in which they are incorporated, do not limit other embodiments of the invention or the invention as a whole, and any reference to the invention, its elements, operation, and application do not limit the invention as a whole but serve only to define these example embodiments. The following detailed description does not, therefore, limit the scope of the invention, which is defined only by the appended claims.

One example embodiment of the invention provides a multiple gate field-effect transistor (MuGFET) built from an overlapping mesh assembly. The assembly comprises a first layer comprising a semiconductor material formed into at least one fin, at least one source, and at least one drain. The first layer comprises a portion of a first mesh, electrically separated from the rest of the mesh. Similarly, a second layer is formed over the first layer and electrically isolated from the first layer, the second layer being electrically conductive and comprising a gate for the at least one fin of the transistor. The second layer comprises a portion of a second mesh offset from the first mesh and overlapping the first mesh, the second layer of the MuGFET device electrically separated from the rest of the second mesh.

Figure 1:
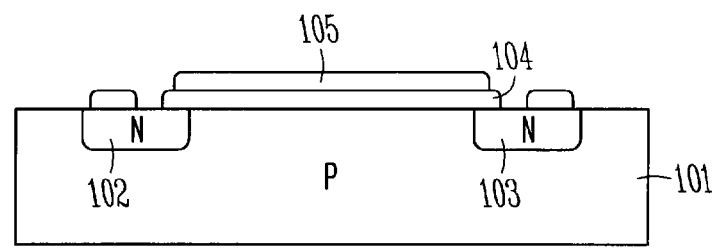
FIG. 1 illustrates a typical n-type field effect transistor, consistent with the prior art.

FIG. 1 illustrates a typical n-type field effect transistor, consistent with the prior art. A semiconductor substrate has a p-type region, such as a silicon substrate doped with boron, as shown at 101. Two n-type semiconductor regions are formed at 102 and 103, such as by ion implantation of a dopant such as phosphorous. These two regions are known as the source and the drain, as one region is used as the source of charge carriers conducted across the channel region, while the other drains the conducted charge carriers. An insulating layer, such as a semiconductor oxide, is formed at 104, separating the channel region of the p-type substrate located between the source 102 and drain 103 from a metal gate 105. The gate is therefore electrically isolated from the source, drain, and channel region of the substrate, and influences conduction across the channel region between the source and drain by an electric field generated as a result of application of voltage to the gate 105.

With no voltage applied to the gate, the channel region of the substrate does not conduct, and essentially no electricity is able to flow between the source 102 and the drain 103. Even with application of increasingly large voltage across the source 102 and drain 103, only a small amount of leakage current is able to flow across the channel region unless an excessive voltage known as the breakdown voltage is applied across the source and the drain, and the transistor is destroyed. When a potential is applied to the gate and the source-drain voltage is small, the channel region acts like a resistor that varies in resistance with the applied voltage, enabling the FET to operate essentially as a voltage-controlled resistor. When larger voltages are applied across the source and drain, or when the gate voltage is relatively near the source or drain voltages, the FET will be turned almost completely on or off, acting more like a switch than a resistor as is common in digital electronic applications.

Figure 2:
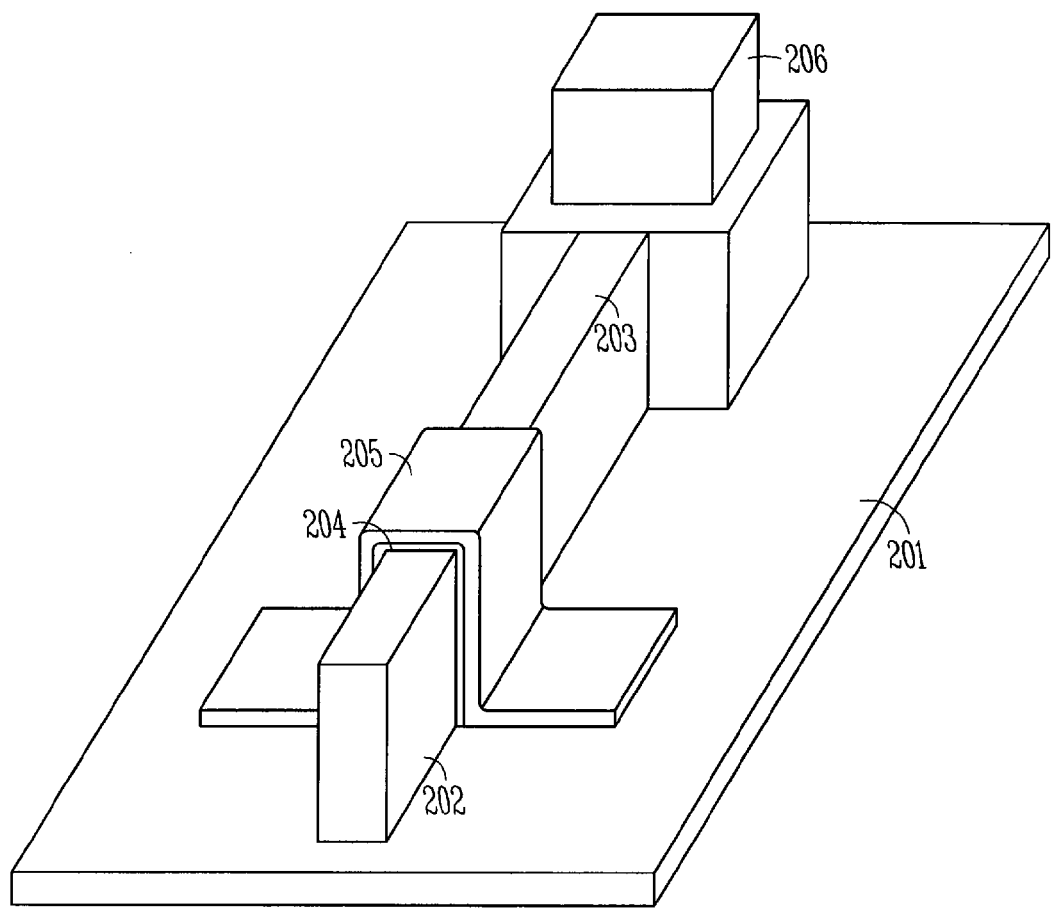
FIG. 2 illustrates a multiple gate field effect transistor having a fin-type channel region, consistent with the prior art.

FIG. 2 illustrates a field effect transistor having a fin-type channel region, consistent with the prior art. The FET of FIG. 2 is sometimes referred to as a FinFET, as the channel structure resembles a fin. The device of FIG. 2 is a multiple gate FET, or MuGFET, as gate regions are formed on three sides of the fin structure.

The MuGFET of FIG. 2 is formed on a substrate 201, such as a doped or undoped silicon substrate or an insulator. A source region 202 and a drain region 203 of the transistor are formed of a doped semiconductor material, such as n-type silicon doped with phosphorous, while the channel region hidden from view under the gate oxide 204 and gate 205 is p-type silicon, doped with boron. The channel region is covered with an insulator material such as silicon oxide, as shown at 204, separating the channel region from the gate 205. The gate structure of this example wraps around three sides of the fin-shaped structure comprising the channel, forming a field effect transistor that appears more like a fin than the flat FET structure of FIG. 1.

The FET itself operates much the same as the FET of FIG. 1, except that the gate 205 has sections parallel and close to three different channel regions of the doped silicon material under the insulating gate oxide material 204. The fin therefore operates effectively as having three separate channel regions, each controlled by the same gate 205. The resulting FET structure therefore has a relatively large channel area for the physical size of the FET, meaning that more transistors can be packed into the same area carrying more current that is possible using traditional methods such as that shown in FIG. 1.

But, efficiencies gained by very small transistor device sizes can be limited by the need to provide electrical connection to the source, gate, and drain, and can be further limited by the difficulty in forming very small features using modern lithography equipment. In a typical MuGFET as shown in FIG. 2, the source 202 and drain 203 are coupled to contact areas large enough so that metal contacts such as that shown at 206 can be formed. The fin material forming the source and drain regions must therefore be enlarged a certain distance away from the gate region of the MuGFET to provide a suitable landing pad area for the contacts such as 206 to be formed.

Figure 3:
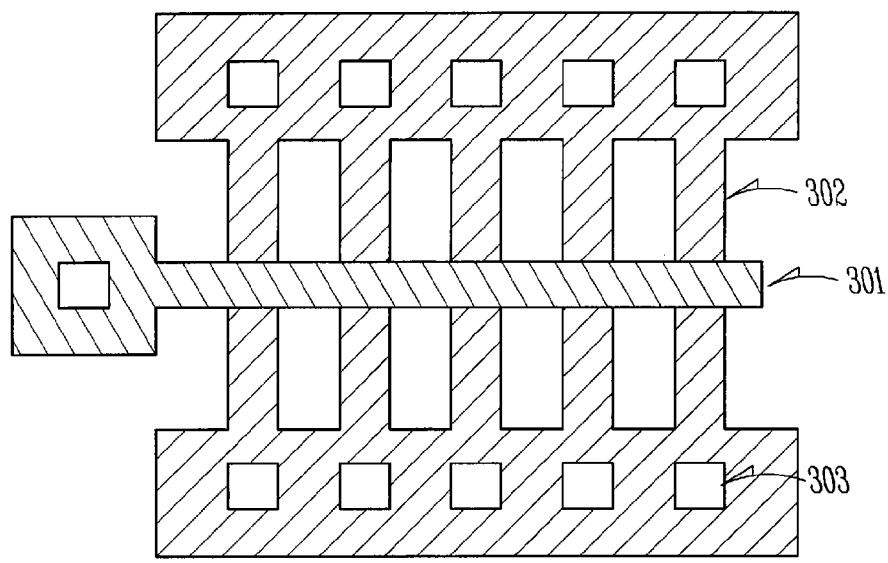
FIG. 3 illustrates a number of electrical contacts formed to provide source and drain electrical connections for a five-fin MuGFET, consistent with an example embodiment of the invention.

A more detailed example of a multiple fin MuGFET is shown in FIG. 3, which illustrates a number of electrical contacts formed to provide source and drain electrical connections for a five-fin MuGFET. In this example, the gate shown at 301 extends across five fins 302, each fin parallel to the other fins and perpendicular to the direction of the gate. The fins 302 are in contact with a silicon region having a group of five source contacts, as shown at 303, for both the source and drain sides of the fins. Although the actual fin geometry of the MuGFET of FIG. 3 is relatively small, the contact geometry of the structure shown in FIG. 3 is relatively large, limiting the size advantage gained by use of a FinFET or MuGFET configuration.

Figure 4:
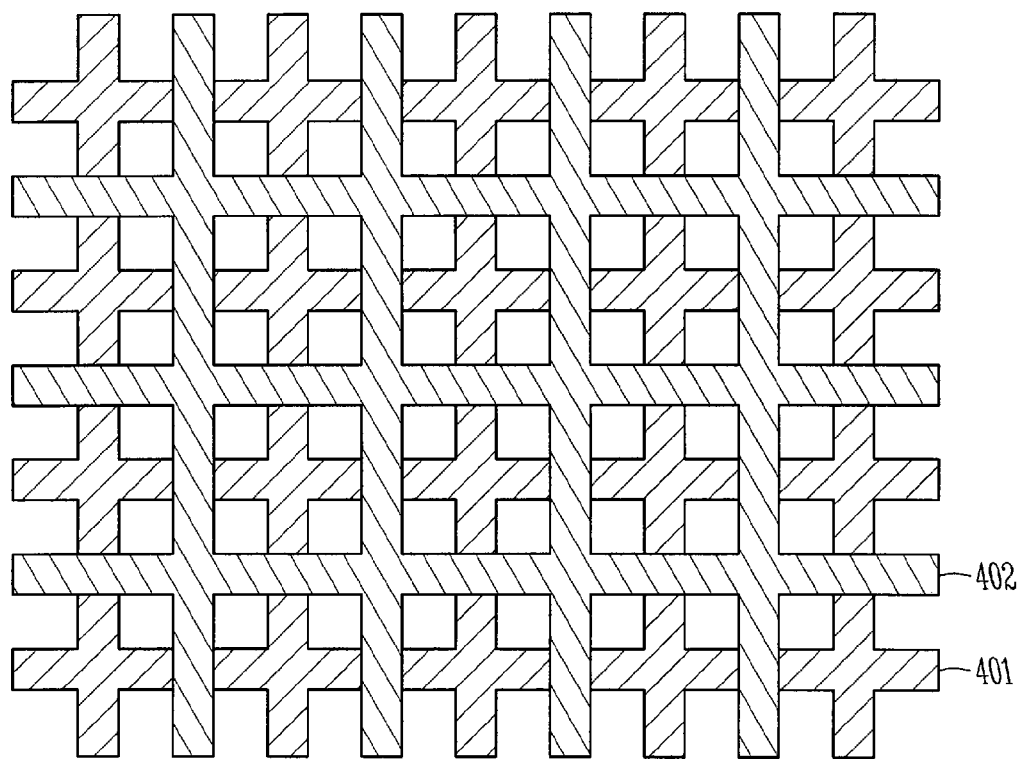
FIG. 4 illustrates an improved fin MuGFET structure by using a double mesh, consistent with an example embodiment of the invention.

One example embodiment of the invention seeks to provide an improved multiple fin MuGFET structure by using a double mesh, as shown in FIG. 4. The double mesh is formed such that a first mesh 401 is formed of a series of perpendicular and parallel silicon fins, such as a p-type doped silicon or undoped silicon, and is covered with an oxide layer. The oxide layer is either selectively applied or selectively removed from the first mesh 401, so that some portions of the p-type mesh will remain covered with oxide and be used as the channel region of a MuGFET structure, and other regions of the first mesh will not be covered by oxide and will be doped by an n-type dopant to form the source and drain regions of the same MuGFET structures.

A second mesh 402 is then formed over the first mesh and the oxide layer, offset from the first mesh such as is shown in FIG. 4. The second mesh is formed over oxide covered portions of the first mesh, so that the first and second meshes are electrically isolated from one another. The second mesh will serve as the gate for one or more fins of the MuGFET assembly, and in various embodiments is polysilicon, metal, or another substantially conductive material.

The double mesh structure of FIG. 4 is then filled with contacts, as shown in FIG. 5. Here, contacts are formed at each intersection of the various elements of the mesh, but in other embodiments are selectively formed at selected intersections of various mesh elements. Although the intersection of the perpendicular mesh segments of the two mesh layers theoretically have square edges as shown in FIG. 5b, in practice the limits of lithography technology or use of non-square resist mask elements results in a larger intersection area, as shown in FIG. 5c.

Figure 6:
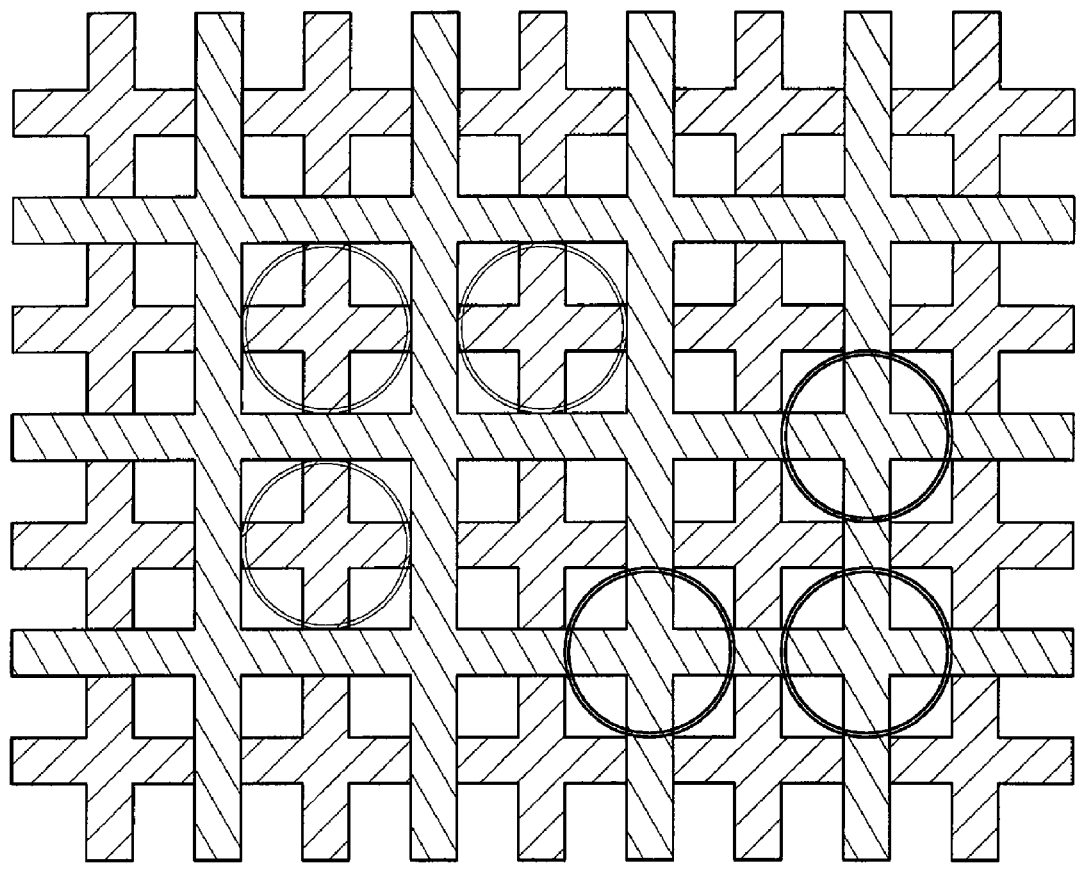
FIG. 6 illustrates use of round resist holes to form a mesh, resulting in intersections that form relatively large contact pads, consistent with an example embodiment of the invention.
Figure 6:
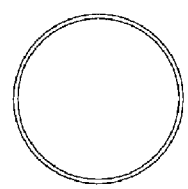
Figure 6:
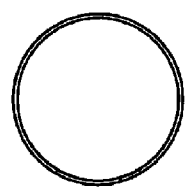

One example of use of round resist "holes" to form the mesh, resulting in intersections that form relatively large contact pads, is shown in FIG. 6. In this example, the intersections of the perpendicular mesh elements will be somewhat rounded and not square, resulting in a relatively large intersection area. This provides a large area for a contact to be formed, while leaving the fin structure relatively narrow, resulting in a MuGFET structure having both the desired small overall device size and large contact area.

Either before or after the contacts are formed, various parts of the mesh are broken, isolating certain mesh segments. This is performed in one example by use of a trim mask that can be applied to a standardized mesh configuration to form a desired array of MuGFET devices. The isolated mesh segment forms in the example shown in FIG. 7 a five-fin MuGFET, similar to that shown in FIG. 3, but with improved geometry and with the ability to form other MuGFET devices using other mesh segments very near the device of FIG. 7.

Figure 7:
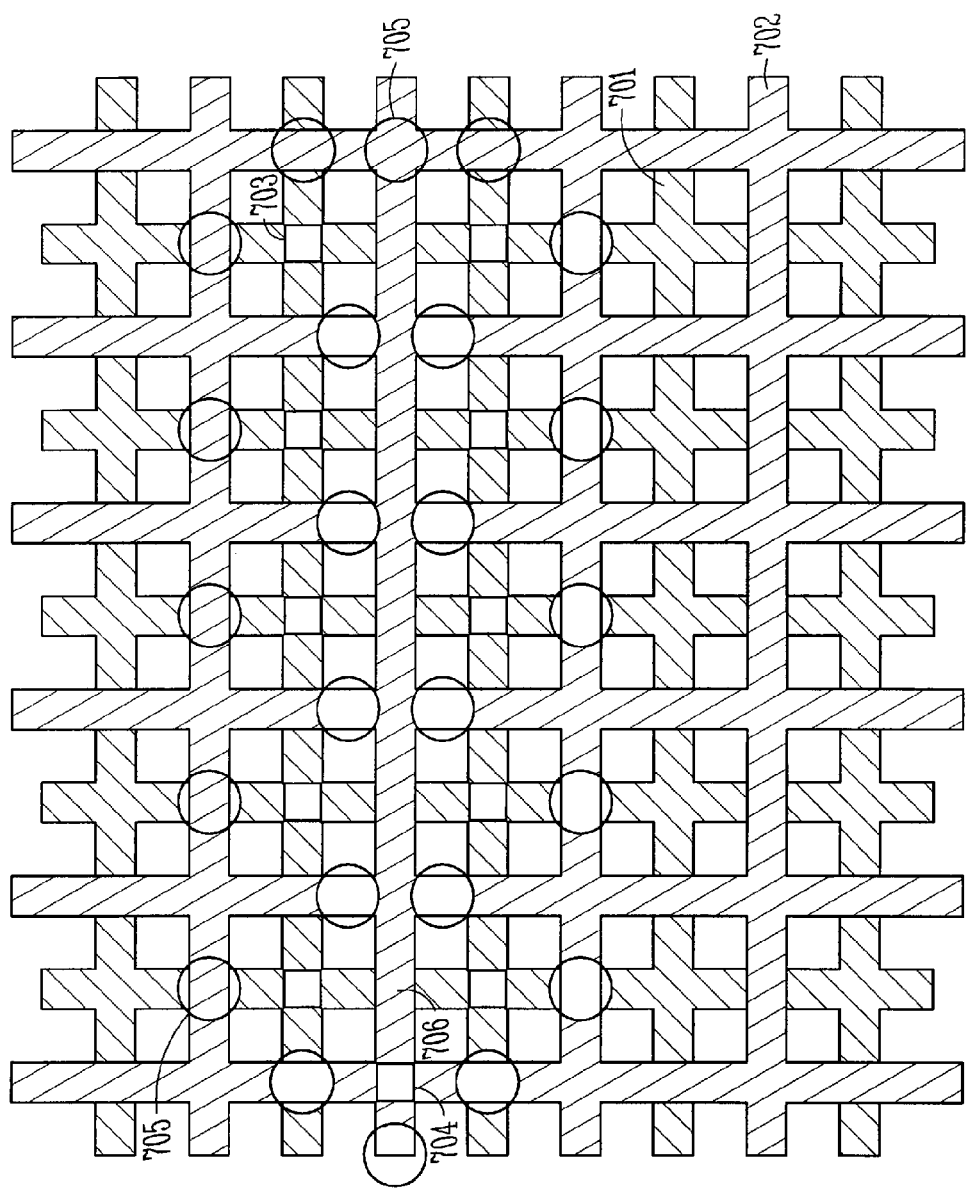
FIG. 7 illustrates a five-fin multiple gate field effect transistor (MuGFET) device formed from an overlapping mesh assembly, consistent with an example embodiment of the invention.

FIG. 7 shows a first mesh of doped silicon 701, and an offset, overlapping second mesh of a conductor such as metal or polysilicon shown at 702. The second mesh is electrically isolated from the first mesh, such as by oxidizing a thin layer of silicon on the surface of the first mesh or by applying an insulator such as silicon oxide to at least the portions of the first mesh that will overlap with the second mesh before the second mesh is formed.

The first mesh 701 has five contact pads formed at junction points of elements of the mesh in one row, forming drain connections, and five contact pads formed at junction points of an adjacent row, forming source connections. In examples where the first mesh is oxidized before formation of the second mesh or where oxide is applied over the entire first mesh, the oxide over the contact areas of the first mesh is removed so that electrical connection to the underlying silicon can be made. The second mesh 702 similarly has a contact pad 704 formed thereon, used as a gate connection.

To form the five-fin MuGFET device from the overlapping offset meshes shown in FIG. 7, connections from the device portion of the mesh to other parts of the mesh are broken, such as by using an etch or trim mask, or by other means of breaking the mesh such as laser ablation. Several ablation points are marked with circles in FIG. 7, illustrating points at which the first mesh that forms the source, drain, and channel/fin portions of the MuGFET are separated from the rest of the first mesh as well as the points at which the portion of the second mesh that forms the gate of the MuGFET device is separated from the rest of the second mesh.

Each intersection 706 of the first and second mesh layers that is a part of the device isolated by the ablation or separation from the rest of the mesh comprises a MuGFET, having a source, drain, and channel region formed by the first mesh and an electrically isolated gate formed by the second mesh. This method enables formation of relatively dense MuGFET devices, as well as relatively easy customization of the configuration of the FET devices and the number of fins for each device using a standard mask or ablation pattern applied to the standardized mesh configuration.

Figure 8:
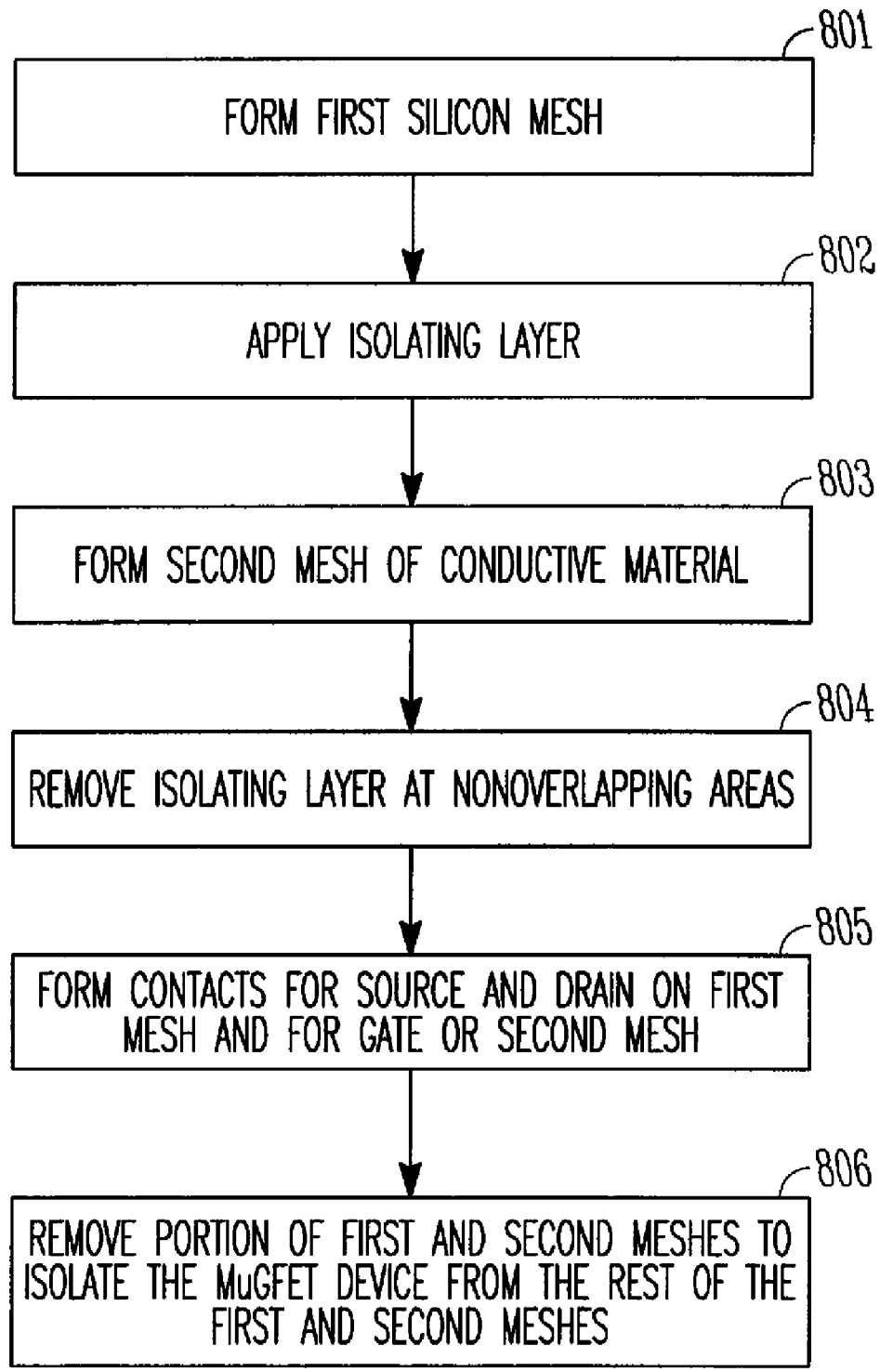
FIG. 8 is a flowchart, illustrating one example method of forming a MuGFET device consistent with an example embodiment of the invention

FIG. 8 is a flowchart, illustrating one example method of forming a MuGFET device consistent with an example embodiment of the invention. At 801, a first mesh is formed, and is in some embodiments doped with a p-type material such as boron. This material is then covered in at least some selected areas with an isolating layer such as an oxide layer at 802. In one example, the oxide layer is formed in those portions of the grid elements that are between element intersections, where the overlapping conductive mesh will overlay the first mesh. In another example, the silicon forming the first mesh is oxidized in those portions not masked, forming an oxide layer on the same portions of the first mesh.

A second mesh is then formed over the first mesh at 803, similar in pitch but offset from the first mesh as shown in the previous figures such as FIG. 7. The second mesh is made of a conductive material, and is electrically insulated from the first mesh by the oxide layer formed at 802. The isolating oxide layer is then removed from those portions of the first mesh not covered by the second mesh at 804.

In a further example, the exposed portions of the first mesh not covered by the oxide layer or by the second mesh are doped with an n-type dopant, forming doped regions of the first mesh that will become the source and drain regions of the formed MuGFET transistor devices. These portions are doped at other times, with other dopants, and selected via other methods in other embodiments.

Contacts are then formed at the intersection points of the various meshes at 805, including forming electrical contacts at the intersection points of mesh elements of the first mesh for source and drain connections of electrical devices. Similarly, electrical contacts are formed at intersections of the second mesh layer, to be used as gate connections for transistor devices. In alternate embodiments, the contacts are selectively formed on certain grid intersection points at this time or at another time, depending on the transistor device configuration eventually formed from the overlapping meshes.

The portions of the first and second meshes that couple that part of the mesh to be used as a MuGFET device to the remainder of the meshes are then ablated or broken at 806, so that the transistor's various conductive elements are electrically isolated from the rest of the mesh at 807. The portions of the first mesh used to form the fins, the source contacts, and the drain contacts are isolated from the rest of the mesh, and the portions of the second mesh used to form the gate contact and the gate conductors formed over the oxide layers of the transistor fins are isolated from the rest of the second mesh. A single overlapping offset mesh assembly can be used to form a variety of transistor devices from the same mesh assembly in this manner, forming complex electrical circuits or large arrays of transistors. A variety of other mesh orientations and configurations are possible, including perpendicular and angular meshes, meshes of varying sizes, and meshes of varying compositions or materials, all of which are within the scope of the various embodiments of the invention.

The overlapping mesh method of device formation illustrated here provides a very dense and regular structure, with the mesh element width and element-to-element distance selected to provide the desired fin size and spacing between source and drain. Although specific embodiments have been illustrated and described herein, it will be appreciated by those of ordinary skill in the art that any arrangement that achieve the same purpose, structure, or function may be substituted for the specific embodiments shown. This application is intended to cover any adaptations or variations of the example embodiments of the invention described herein. It is intended that this invention be limited only by the claims, and the full scope of equivalents thereof.

The invention claimed is:

1. A fin field-effect transistor, comprising:
   a substrate;
   a first layer comprising a semiconductor material formed into at least one fin, at least one source, and at least one drain, the first layer comprising a portion of a first mesh electrically separated from the rest of the mesh; and
   a second layer formed over the first layer and electrically isolated from the first layer, the second layer electrically conductive and comprising a gate for the at least one fin of the transistor, the second layer comprising a portion of a second mesh offset from the first mesh and overlapping the first mesh, the second layer electrically separated from the rest of the second mesh.

2. The fin field-effect transistor of claim 1, wherein the transistor comprises multiple fins, each of the multiple fins comprising a channel of the transistor and each of the fins comprising a part of the first layer, and wherein the second layer further comprises a gate for each of the multiple fins.

3. The fin field-effect transistor of claim 1, wherein the first mesh and the second mesh comprise multiple electrically separated fin field-effect transistors.

4. The fin field-effect transistor of claim 1, wherein at least one of the first and second meshes comprise an intersecting grid of elements, and wherein a contact area is formed on at least one intersection of the grid elements.

5. The fin field-effect transistor of claim 1, wherein a channel portion of the first layer is doped with a first dopant, and the source and drain portions of the first layer are doped with a second dopant.

6. The fin field-effect transistor of claim 1, wherein at least one of the first mesh and the second mesh are formed via an array of resist dots.

7. The fin field-effect transistor of claim 1, wherein the elements of at least one of the first and second mesh are at least partially self-aligning.

8. A fin field-effect transistor mesh assembly, comprising:
   a substrate;
   a first mesh comprising a grid of intersecting elements, the first mesh comprising a semiconductor material;
   a second mesh comprising a grid of intersecting elements offset from the first mesh and overlapping the first mesh, the second mesh comprising a conductive material;
   an insulating layer formed on at least a portion of at least the first or second mesh, the insulating layer electrically separating the first mesh from the second mesh; and a plurality of electrical contacts, the contacts formed on at least one of the first or second meshes at the intersection of intersecting grid elements.

9. The fin field-effect transistor mesh assembly of claim 8, wherein the insulating comprises a silicon oxide layer.

10. The fin field-effect transistor mesh assembly of claim 8, wherein at least one intersection between the first and second meshes forms a FinFET.

11. The fin field-effect transistor mesh assembly of claim 8, wherein a first portion of the first mesh is doped with a first dopant to form a channel region, and second and third portions of the mesh are doped with a second dopant to form source and drain regions.

12. The fin field-effect transistor mesh assembly of claim 8, wherein a contact area is formed on at least one intersection of elements of the first grid or elements of the second grid.

13. The fin field-effect transistor mesh assembly of claim 8, wherein a portion of the first and second meshes is isolated from the rest of the first and second meshes to form an electrically isolated FinFET device.

14. The fin field-effect transistor mesh assembly of claim 13, wherein the separated portion is separated by ablating a portion of the first and second meshes.

\* \* \* \* \*